(12) United States Patent
Matsuo et al.

(10) Patent No.: US 7,230,743 B2
(45) Date of Patent: Jun. 12, 2007

(54) OPTICAL DEFLECTOR ARRAY

(75) Inventors: Daisuke Matsuo, Hachioji (JP);
Yoshitaka Kamiya, Hachioji (JP);
Hiroshi Miyajima, Hachioji (JP);
Masahiro Nishio, Hachioji (JP)

(73) Assignee: Olympus Corporation, Tokyo (JP)

( * ) Notice: Subject to any disclaimer, the term of this patent is extended or adjusted under 35 U.S.C. 154(b) by 123 days.

(21) Appl. No.: 10/999,772

(22) Filed: Nov. 30, 2004

(65) Prior Publication Data

US 2005/0099671 A1 May 12, 2005

(30) Foreign Application Priority Data

Jan. 12, 2003 (JP) .............................. 2003-402136

(51) Int. Cl.
*G02B 26/08* (2006.01)
(52) U.S. Cl. ..................... 358/223; 359/198; 359/225
(58) Field of Classification Search ................ 359/198, 359/223–225, 291, 290, 298
See application file for complete search history.

(56) References Cited

U.S. PATENT DOCUMENTS

| 6,201,629 | B1 | 3/2001 | McClelland et al. |
| 6,388,789 | B1 | 5/2002 | Bernstein |
| 6,455,927 | B1 | 9/2002 | Glenn et al. |
| 6,464,363 | B1 * | 10/2002 | Nishioka et al. ............ 359/846 |
| 6,989,921 | B2 * | 1/2006 | Bernstein et al. ........... 359/290 |
| 2002/0050744 | A1 | 5/2002 | Bernstein et al. |
| 2002/0130561 | A1 | 9/2002 | Temesvary et al. |
| 2003/0174035 | A1 | 9/2003 | Arima |
| 2003/0218793 | A1 * | 11/2003 | Soneda et al. .............. 359/291 |

FOREIGN PATENT DOCUMENTS

| EP | 1 215 168 A1 | 9/2002 |
| JP | 1 251 382 A1 | 10/2002 |
| JP | 0 692 729 B1 | 4/2003 |

* cited by examiner

*Primary Examiner*—Ramon M. Barrera
(74) *Attorney, Agent, or Firm*—Scully, Scott, Murphy & Presser, P.C.

(57) ABSTRACT

An optical deflector array has a first board, second board, and magnetic field generator. The first board has movable plates respectively having reflecting surfaces, wirings passing through the respective movable plates, and first connecting portions provided at the two ends of the each wiring. The second board has second connecting portions electrically connected to the first connecting portions of the first board, third connecting portions for external electrical connection, and connecting wirings electrically connecting the second connecting portions and the third connecting portions. The optical deflector array further has connecting members that electrically connect the first connecting portions of the first board to the second connecting portions of the second board.

4 Claims, 10 Drawing Sheets

US 7,230,743 B2

OPTICAL DEFLECTOR ARRAY

CROSS-REFERENCE TO RELATED APPLICATIONS

This application is based upon and claims the benefit of priority from prior Japanese Patent Application No. 2003-402136, filed Dec. 1, 2003, the entire contents of which are incorporated herein by reference.

BACKGROUND OF THE INVENTION

1. Field of the Invention

The present invention relates to an optical deflector array including optical deflectors, which deflect light beams.

2. Description of the Related Art

The specification of U.S. Pat. No. 6,388,789 discloses an electromagnetically actuated optical deflector array. The electromagnetically actuated optical deflector array includes optical deflectors. Wirings extend from each optical deflector. Many wirings ((number of wirings per optical deflector)×(number of optical deflectors) wirings) extending from the optical deflectors are respectively connected, for external electrical connection, to many connecting pads that are provided on the outer peripheral portion of the optical deflector array.

In this optical deflector array, the wirings from a specific optical deflector extend so as to avoid the wirings extending from the remaining optical deflectors. For this reason, the optical deflectors are arranged at intervals sufficient to allow the wirings extend between them. In other words, spaces sufficient for the passage of the wirings must be ensured between the optical deflectors. This hinders an increase in the packing density of optical deflectors. In addition, the spaces to be ensured between optical deflectors increase with an increase in the number of optical deflectors included in the optical deflector array.

BRIEF SUMMARY OF THE INVENTION

The present invention is directed to an optical deflector array including electromagnetically actuated optical deflectors. An optical deflector array according to the present invention has a first board having movable plates respectively having reflecting surfaces, wirings passing through the respective movable plates, and first connecting portions provided at two ends of the each wiring, a second board having second connecting portions electrically connected to the first connecting portions of the first board, third connecting portions for external electrical connection, and connecting wirings electrically connecting the second connecting portions and the third connecting portions, connecting members that electrically connect the first connecting portions of the first board to the second connecting portions of the second board, and magnetic field generating means for generating a magnetic field.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the present invention, and together with the general description given above and the detailed description of the embodiments given below, serve to explain the principles of the present invention.

DETAILED DESCRIPTION OF THE INVENTION

The embodiments of the present invention will be described below with reference to the views of the accompanying drawing.

First Embodiment

Although this embodiment is directed to an optical deflector array, a unit electromagnetically actuated optical deflector of the optical deflector array will be described prior to the description of the optical deflector array.

Figure 1:
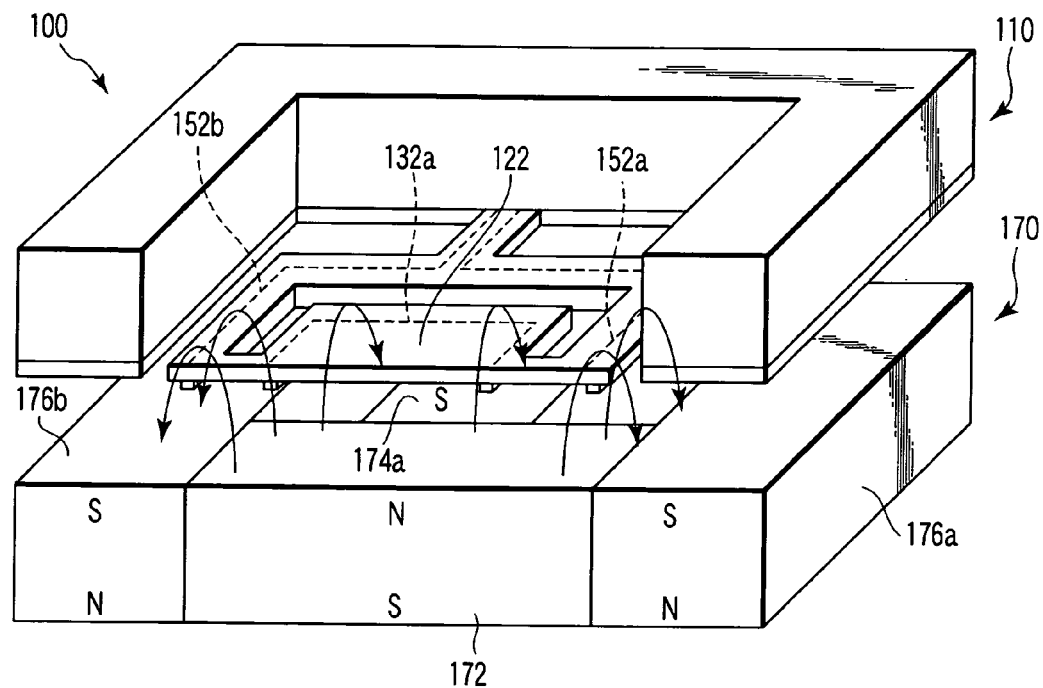
FIG. 1 is a sectional perspective view of a unit optical deflector of an optical deflector array according to the first embodiment of the present invention.
Figure 2:
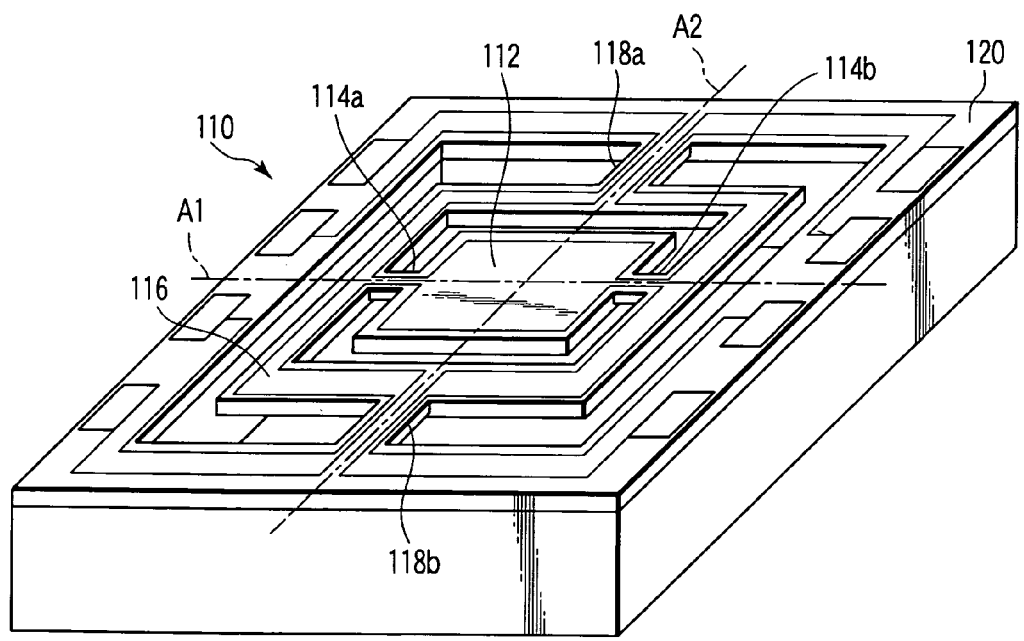
FIG. 2 is a perspective view of a movable plate unit in FIG. 1.
Figure 3:
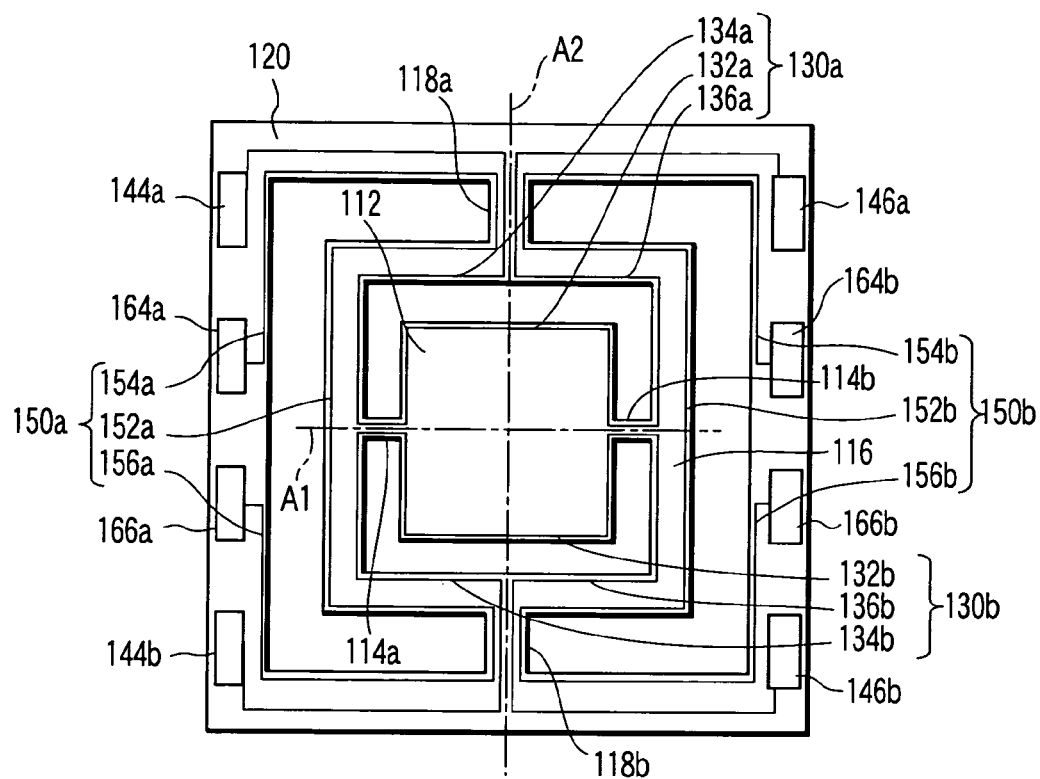
FIG. 3 is a plan view of the movable plate unit in FIG. 2.
Figure 4:
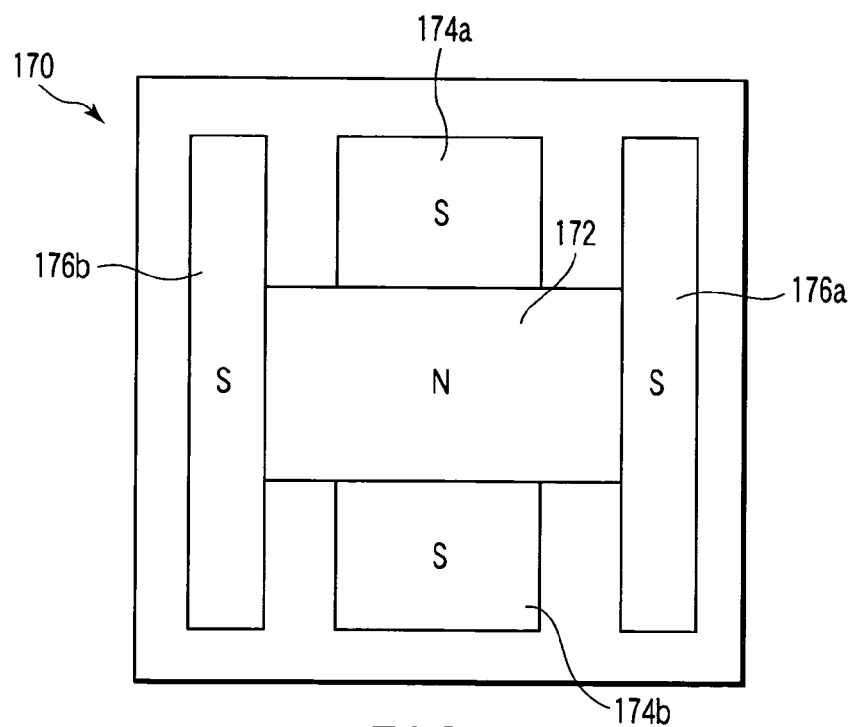
FIG. 4 is a plan view of a magnet unit in FIG. 1.

FIG. 1 is a sectional perspective view of a unit optical deflector of an optical deflector array according to the first embodiment of the present invention. FIG. 2 is a perspective view of a movable plate unit shown in FIG. 1. The movable plate unit shown in FIG. 2 is an upside down view of that shown in FIG. 1. FIG. 3 is a plan view of the movable plate unit shown in FIG. 2. FIG. 4 is a plan view of a magnet unit shown in FIG. 1.

As shown in FIG. 1, a two-dimensional optical deflector 100 includes a magnet unit 170, which generates a magnetic field, and a movable plate unit 110 placed in the magnetic field generated by the magnet unit 170. The movable plate unit 110 and magnet unit 170 are arranged at a predetermined interval.

As shown in FIGS. 2 and 3, the movable plate unit 110 includes an inner movable plate 112, an outer movable plate 116 located outside the inner movable plate 112, two inner torsion bars (first inner torsion bar 114a and second inner torsion bar 114b) connecting the inner movable plate 112 and the outer movable plate 116, a support 120 located outside the outer movable plate 116, and two outer torsion bars (first outer torsion bar 118a and second outer torsion bar 118b) connecting the outer movable plate 116 and the support 120.

Although the outer movable plate 116 is in the form of a frame surrounding the inner movable plate 112, the form of the outer movable plate 116 is not specifically limited to this. Although the support 120 is in the form of a frame surrounding the outer movable plate 116, the form of the support 120 is not limited to this, and may have another shape such as a U shape. In addition, the support 120 is formed from one member, but may be formed from two members that are spaced apart from each other.

As shown in FIG. 1, the inner movable plate 112 has, on its upper surface, a reflecting surface 122 for reflecting light. The reflecting surface 122 is formed from, for example, a thin gold film. In this case, the upper surface of the inner movable plate 112 is one of the two largest parallel flat surfaces. Referring to FIG. 1, the upper surface is the one seen and located on the upper side. In addition, referring to FIG. 1, the surface that is located on the lower side and is hidden from the eye will be referred to as a lower surface.

As shown in FIGS. 2 and 3, the two inner torsion bars 114a and 114b extend on a generally straight line along a first axis A1. The two outer torsion bars 118a and 118b also extend on a generally straight line along a second axis A2. The first and second axes A1 and A2 are generally perpendicular to each other. The outer torsion bars 118a and 118b are capable of twisting and deforming about the second axis A2 and allow the outer movable plate 116 to tilt about the second axis A2 with respect to the support 120. The inner torsion bars 114a and 114b are capable of twisting and deforming about the second axis and allow the inner movable plate 112 to oscillate about the first axis A1 with respect to the outer movable plate 116.

This allows the direction of the reflecting surface 122 of the inner movable plate 112 to be two-dimensionally changed. The two-dimensional optical deflector 100 can two-dimensionally deflect the light beam reflected by the reflecting surface 122 of the two-dimensional optical deflector 100. In general, when the two-dimensional optical deflector 100 is to be applied to two-dimensional scanning, the first axis A1 is selected as an oscillation axis on the high-speed side, and the second axis A2 is selected as an oscillation axis on the low-speed side.

The movable plate unit 110 is manufactured from a silicon substrate by using a semiconductor manufacturing process. The inner movable plate 112 and outer movable plate 116 are formed from, for example, thin silicon plates obtained by processing a silicon substrate. The inner torsion bars 114a and 114b and outer torsion bars 118a and 118b are formed from, for example, a thin silicon film or thin polyimide film. The material to be used for the inner movable plate 112, outer movable plate 116, support 120, inner torsion bars 114a and 114b, and outer torsion bars 118a and 118b may include polysilicon, silicon nitride, an organic material, a metal material, and the like in addition to silicon and polyimide.

As shown in FIG. 3, the movable plate unit 110 further includes two inner wirings (first inner wiring 130a and second inner wiring 130b) extending on the inner movable plate 112, inner torsion bars 114a and 114b, outer movable plate 116, outer torsion bars 118a and 118b, and support 120. The first inner wiring 130a includes a first inner drive wiring portion 132a and two first inner extracted wiring portions 134a and 136a respectively extending from the two ends of the first inner drive wiring portion 132a. Likewise, the second inner wiring 130b includes a second inner drive wiring portion 132b and two second inner extracted wiring portions 134b and 136b respectively extending from the two ends of the second inner drive wiring portion 132b.

In this case, the inner drive wiring portions 132a and 132b, which are parts of the inner wirings 130a and 130b that actually contribute to the actuation of the inner movable plate 112, are located near edge portions on the inner movable plate 112, and extend parallel to the first axis A1. The first inner extracted wiring portions 134a and 136a are parts of the first inner wiring 130a that exclude the first inner drive wiring portion 132a. Likewise, the second inner extracted wiring portions 134b and 136b are parts of the second inner wiring 130b that exclude the second inner drive wiring portion 132b.

As is obvious from FIG. 3, the first inner drive wiring portion 132a and second inner drive wiring portion 132b are located generally symmetrically with respect to the first axis A1.

Referring to FIG. 3, the first inner extracted wiring portion 134a extending from the left end portion of the first inner drive wiring portion 132a on the upper side extends downward along by the periphery of the inner movable plate 112, passes through the first inner torsion bar 114a on the left side, extends upward along by the inner edge of the outer movable plate 116, passes through the first outer torsion bar 118a on the upper side, extends to the left on the support 120, and is terminated at an electrode pad 144a provided on the support 120.

The first inner extracted wiring portion 136a extending from the right end portion of the first inner drive wiring portion 132a extends downward along by the periphery of the inner movable plate 112, passes through the second inner torsion bar 114b on the right side, extends upward along by the periphery of the outer movable plate 116, passes through the first outer torsion bar 118a on the upper side, extends to the right on the support 120, and is terminated at an electrode pad 146a provided on the support 120.

As is obvious from FIG. 3, the first inner extracted wiring portion 134a and first inner extracted wiring portion 136a are located generally symmetrically with respect to the first axis A1.

The second inner extracted wiring portion 134b extending from the left end portion of the second inner drive wiring portion 132b on the lower side extends upward along by the periphery of the inner movable plate 112, passes through the first inner torsion bar 114a on the left side, extends downward along by the periphery of the outer movable plate 116, passes through the second outer torsion bar 118b on the lower side, extends to the left on the support 120, and is terminated at an electrode pad 144b provided on the support 120.

The second inner extracted wiring portion 136b extending from the right end portion of the second inner drive wiring portion 132b extends upward along by the periphery of the inner movable plate 112, passes through a second inner torsion bar 114b on the right side, extends downward along by the inner edge of the outer movable plate 116, passes through the second outer torsion bar 118b on the lower side, extends to the right on the support 120, and is terminated at an electrode pad 146b provided on the support 120.

As is obvious from FIG. 3, the second inner extracted wiring portion 134b and second inner extracted wiring portion 136b are located generally symmetrically with respect to the first axis A1.

The movable plate unit 110 further includes two outer wirings (first outer wiring 150a and second outer wiring 150b) extending on the outer movable plate 116, outer torsion bars 118a and 118b, and support 120. The first outer wiring 150a includes a first outer drive wiring portion 152a and two first outer extracted wiring portions 154a and 156a respectively extending from the two ends of the first outer drive wiring portion 152a. Likewise, the second outer wiring 150b includes a second outer drive wiring portion 152b and two second outer extracted wiring portions 154b and 156b respectively extending from the two ends of the second outer drive wiring portion 152b.

In this case, the outer drive wiring portions 152a and 152b, which are respectively parts of the outer wirings 150a and 150b that actually contribute to the actuation of the outer movable plate 116, are located near edge portions on the outer movable plate 116, and extend parallel to the second axis A2. The first outer extracted wiring portions 154a and 156a are parts of the first outer wiring 150a that exclude the first outer drive wiring portion 152a. Likewise, the second outer extracted wiring portions 154b and 156b are parts of the second outer wiring 150b that exclude the second outer drive wiring portion 152b.

As is obvious from FIG. 3, the first outer drive wiring portion 152a and second outer drive wiring portion 152b are located generally symmetrically with respect to the second axis A2.

Referring to FIG. 3, the first outer extracted wiring portion 154a extending from the upper end portion of the first outer drive wiring portion 152a on the left side extends to the right along by the outer edge of the outer movable plate 116, passes through the first outer torsion bar 118a on the upper side, extends to the left on the support 120, and is terminated at an electrode pad 164a provided on the support 120.

The first outer extracted wiring portion 156a extending from the lower end portion of the first outer drive wiring portion 152a extends to the right along by the outer edge of the outer movable plate 116, passes through the second outer torsion bar 118b on the lower side, extends to the left on the support 120, and is terminated at an electrode pad 166a provided on the support 120.

As is obvious from FIG. 3, the first outer extracted wiring portion 154a and first outer extracted wiring portion 156a are located generally symmetrically with respect to the first axis A1.

The second outer extracted wiring portion 154b extending from the upper end portion of the second outer drive wiring portion 152b on the right side extends to the left along by the outer edge of the outer movable plate 116, passes through the first outer torsion bar 118a on the upper side, extends to the right on the support 120, and is terminated at an electrode pad 164b provided on the support 120.

The second outer extracted wiring portion 156b extending from the lower end portion of the second outer drive wiring portion 152b extends to the left along by the outer edge of the outer movable plate 116, passes through the second outer torsion bar 118b on the lower side, extends to the right on the support 120, and is terminated at an electrode pad 166b provided on the support 120.

As is obvious from FIG. 3, the second outer extracted wiring portion 154b and second outer extracted wiring portion 156b are located generally symmetrically with respect to the first axis A1.

Although not specifically shown, the wirings 130a, 130b, 150a, and 150b are preferably covered with insulating films such as silicon oxide films for electrical insulation.

The wirings 130a, 130b, 150a, and 150b and the electrode pads 144a, 144b, 146a, 146b, 164a, 164b, 166a, and 166b are formed from aluminum by using, for example, a semiconductor manufacturing process.

For example, the wirings 130a, 130b, 150a, and 150b and the electrode pads 144a, 144b, 146a, 146b, 164a, 164b, 166a, and 166b are formed by forming an aluminum film on the surface of a structure including the inner movable plate 112, outer movable plate 116, support 120, inner torsion bars 114a and 114b, and outer torsion bars 118a and 118b manufactured from a silicon substrate using a semiconductor manufacturing process as described above, and by patterning the film.

The material to be used for the wirings 130a, 130b, 150a, and 150b and the electrode pads 144a, 144b, 146a, 146b, 164a, 164b, 166a, and 166b may be copper or gold instead of aluminum, preferably a metal having a low resistivity.

As shown in FIG. 4, a magnet unit 170 includes a magnet 172 located in the center, two magnets 174a and 174b located on the two sides of the magnet 172 along the first axis A1, and two magnets 176a and 176b located on the two sides of the magnet 172 along the second axis A2. The magnet 172 has an N pole on the side facing the movable plate unit 110. The magnets 174a and 174b and the magnets 176a and 176b each have an S pole on the side facing the movable plate unit 110. That is, the two adjacent magnets are opposite in magnetization direction. The magnets, 172, 174a, 174b, 176a, and 176b each have a rectangular parallelepiped shape, and are fixed to each other with an adhesive.

As shown in FIG. 1, the movable plate unit 110 and magnet unit 170 are arranged at a predetermined interval. The inner drive wiring portions 132a and 132b extend generally parallel to the boundaries between the magnet 172 and the magnets 174a and 174b. Although the second inner drive wiring portion 132b is not shown in FIG. 1, the positional relationship with the second inner drive wiring portion 132b can easily be understood by referring to FIGS. 3 and 4. The outer drive wiring portions 152a and 152b extend generally parallel to the boundaries between the magnet 172 and the magnets 176a and 176b.

The first inner drive wiring portion 132a is located generally immediately above the boundary between the magnet 172 and the magnet 174a. The second inner drive wiring portion 132b is located generally immediately above the boundary between the magnet 172 and the magnet 174b. The first outer drive wiring portion 152a is located generally immediately above the boundary between the magnet 172 and the magnet 176a. The second outer drive wiring portion 152b is located generally immediately above the boundary between the magnet 172 and the magnet 176b. In this case, "immediately above" indicates a direction that is perpendicular to both the first and second axes A1 and A2 and extends from the magnet unit 170 to the movable plate unit 110.

In this arrangement relationship, the magnetic flux density near the boundary between two adjacent magnets with opposite magnetization directions is high. That is, the first inner drive wiring portion 132a is located in a region where the magnetic flux density is high in the direction from the magnet 172 to the magnet 174a. The second inner drive wiring portion 132b is located in a region where the magnetic flux density is high in the direction from the magnet 172 to the magnet 174b. Likewise, the first outer drive wiring portion 152a is located in a region where the magnetic flux density is high in the direction from the magnet 172 to the magnetic 176a. The second outer drive wiring portion 152b is located in a region where the magnetic flux density is high in the direction from the magnet 172 to the magnet 176b.

As shown in FIG. 1, magnetic lines of force flowing from the magnet 172 to the magnet 174a are generally perpendicular to the boundary between the magnet 172 and the magnet 174a, and hence cross the first inner drive wiring portion 132a at generally right angles. Likewise, magnetic lines of force flowing from the magnet 172 to the magnet 174b are generally perpendicular to the boundary between the magnet 172 and the magnet 174b, and hence cross the second inner drive wiring portion 132b at generally right angles. Magnetic lines of force flowing from the magnet 172 to the magnet 176a are generally perpendicular to the boundary between the magnet 172 and the magnet 176a, and hence cross the first outer drive wiring portion 152a at generally right angles. Likewise, magnetic lines of force flowing from the magnet 172 to the magnet 176b are generally perpendicular to the boundary between the magnet 172 and the magnet 176b, and hence cross the second outer drive wiring portion 152b at generally right angles.

The operation of the above optical deflector will be described next.

For example, a drive power supply (not shown) is used to apply a voltage between the electrode pad 164a and the electrode pad 166a to cause a current to flow from the electrode pad 164a to the electrode pad 166a. In addition, the same voltage is applied between the electrode pad 164b and the electrode pad 166b to cause the same current to flow from the electrode pad 164b to the electrode pad 166b.

Referring to FIG. 3, a downward current flows in the first outer drive wiring portion 152a on the outer movable plate 116. The first outer drive wiring portion 152a is located in outward (leftward) magnetic lines of force, and hence receives the downward Lorentz force in a direction perpendicular to the drawing surface.

Referring to FIG. 3, a downward current flows in the second outer drive wiring portion 152b on the outer movable plate 116. The second outer drive wiring portion 152b is located in outward (rightward) magnetic lines of force, and hence receives the upward Lorentz force in the direction perpendicular to the drawing surface.

The outer movable plate 116 therefore receives a couple of forces about the second axis A2, and the outer torsion bars 118a and 118b twist and deform. This causes the outer movable plate 116 to tilt about the second axis A2. As a consequence, the inner movable plate 112 tilts about the second axis A2 together with the outer movable plate 116. The tilt angle of the outer movable plate 116 depends on the magnitudes of the currents flowing in the outer drive wiring portions 152a and 152b.

For example, a drive power supply (not shown) is used to apply a voltage between the electrode pad 144a and the electrode pad 146a to cause a current to flow from the electrode pad 144a to the electrode pad 146a. In addition, a voltage is applied between the electrode pad 144b and the electrode pad 146b to cause a current to flow from the electrode pad 144b to the electrode pad 146b.

Referring to FIG. 3, a rightward current flows in the first inner drive wiring portion 132a on the inner movable plate 112. The first inner drive wiring portion 132a is located in outward (upward) magnetic lines of force, and hence receives the upward Lorentz force in the direction perpendicular to the drawing surface.

Referring to FIG. 3, a rightward current flows in the second inner drive wiring portion 132b on the inner movable plate 112. The second inner drive wiring portion 132b is located in outward (downward) magnetic lines of force, and hence receives the downward Lorentz force in the direction perpendicular to the drawing surface.

The inner movable plate 112 therefore receives a couple of forces about the first axis A1, and the inner torsion bars 114a and 114b twist and deform. This causes the inner movable plate 112 to tilt about the first axis A1. The tilt angle of the inner movable plate 112 depends on the magnitudes of the currents flowing in the inner drive wiring portions 132a and 132b.

When the inner movable plate 112 is actuated, the Lorentz force as a force component that causes the outer movable plate 116 to tilt about the second axis A2 is generated in parts of the first inner extracted wiring portions 134a and 136a that are located on the outer movable plate 116. However, the Lorentz forces received by the first inner extracted wiring portions 134a and 136a cancel out each other, the forces do not contribute to the tilting of the outer movable plate 116.

More specifically, part of the first inner extracted wiring portion 134a that is located on the outer movable plate 116 and extends parallel to the second axis A2 receives the downward Lorentz force in the direction perpendicular to the drawing surface. In addition, part of the first inner extracted wiring portion 136a that is located on the outer movable plate 116 and extends parallel to the second axis A2 receives the downward Lorentz force in the direction perpendicular to the drawing surface. Since the current flowing in the first inner extracted wiring portion 134a is equal to the current flowing in the first inner extracted wiring portion 136a, the magnitude of the Lorentz force received by the first inner extracted wiring portion 134a is equal to the magnitude of the Lorentz force received by the first inner extracted wiring portion 136a.

The Lorentz force received by the first inner extracted wiring portion 134a and the Lorentz force received by the first inner extracted wiring portion 136a are both components that the outer movable plate 116 to tilt about the second axis A2. However, the two components make the outer movable plate 116 tilt in opposite directions. For this reason, the Lorentz force received by the first inner extracted wiring portion 134a and that received by the first inner extracted wiring portion 136a cancel out each other, and hence make substantially no contribution to the tilting of the outer movable plate 116 about the second axis A2.

This equally applies to the second inner extracted wiring portions 134b and 136b.

More preferably, the magnitude of the current flowing in the first inner wiring 130a is equal to the magnitude of the current flowing in the second inner wiring 130b. In this case, currents flow in opposite directions in two parts of the first and second inner extracted wiring portion 134a and 134b that are located on the outer movable plate 116 and extend generally parallel to the second axis A2 (located relatively near each other on the left side on the outer movable plate 116). For this reason, the Lorentz forces generated in the respective portions by the interaction with magnetic fields cancel out each other. This also applies to the first inner extracted wiring portion 136a and second inner extracted wiring portion 136b. For this reason, the currents, flowing in the inner wirings 130a and 130b, for tilting the inner movable plate 112 have no influence on the tilting of the outer movable plate 116. This makes it possible to independently control the tilting of the inner movable plate 112 about the first axis A1 and that about the second axis A2.

The two-dimensional optical deflector 100 can therefore realize generally completely independent control on the tilting of the inner movable plate 112 about the first axis A1 and that about the second axis A2.

When, for example, the two-dimensional optical deflector 100 is to be used to scan a light beam, AC voltages are applied between the electrode pads 164a and 166a and between the electrode pads 164b and 166b to make in-phase AC currents flow in the outer wirings 150a and 150b. In this case, since the magnitudes of the currents flowing in the first outer drive wiring portions 152a and 152b periodically change, the tilt angle of the outer movable plate 116 about the second axis A2 repeatedly changes. That is, the outer movable plate 116 is made to oscillate about the second axis A2. In addition, AC voltages are applied between the electrode pads 144a and 146a and between the electrode pads 144b and 146b to make AC currents flow in the inner wirings 130a and 130b. In this case, since the magnitudes of the currents flowing in the inner drive wiring portions 132a and 132b periodically change, the tilt angle of the inner movable plate 112 about the first axis A1 repeatedly changes. That is, the inner movable plate 112 is made to oscillate about the first axis A1. As a consequence, the light beam reflected by the reflecting surface 122 of the inner movable plate 112 is two-dimensionally scanned.

When the two-dimensional optical deflector 100 is to be used to deflect a light beam in a predetermined direction, constant voltages are applied between the electrode pads 164a and 166b and between the electrode pads 164b and 166b to make DC currents flow in the same direction in the outer wirings 150a and 150b. In this case, since the magnitudes of the currents flowing in the outer drive wiring portions 152a and 152b are constant, the outer movable plate 116 tilts about the second axis A2 by a predetermined angle. That is, the outer movable plate 116 is deflected about the second axis A2. In addition, DC voltages are applied between the electrode pads 144a and 146a and between the electrode pads 144b and 146b to make DC currents flow in the inner wirings 130a and 130b. In this case, since the magnitudes of the currents flowing in the inner drive wiring portions 132a and 132b are constant, the inner movable plate 112 tiles about the first axis A1 by a predetermined angle. That is, the inner movable plate 112 is deflected about the first axis A1. As a consequence, the light beam reflected by the reflecting surface 122 of the inner movable plate 112 is deflected in a predetermined direction.

As is obvious from the above description, the two-dimensional-optical deflector 100 can make generally completely independent control on the oscillation and deflection of the inner movable plate 112 having the reflecting surface about the first axis A1 and second axis A2. In addition, since the drive wiring portions 132a, 132b, 152a, and 152b are arranged in the regions where the magnetic flux densities are high, the actuation efficiency is high, and the power consumption is low.

Figure 5:
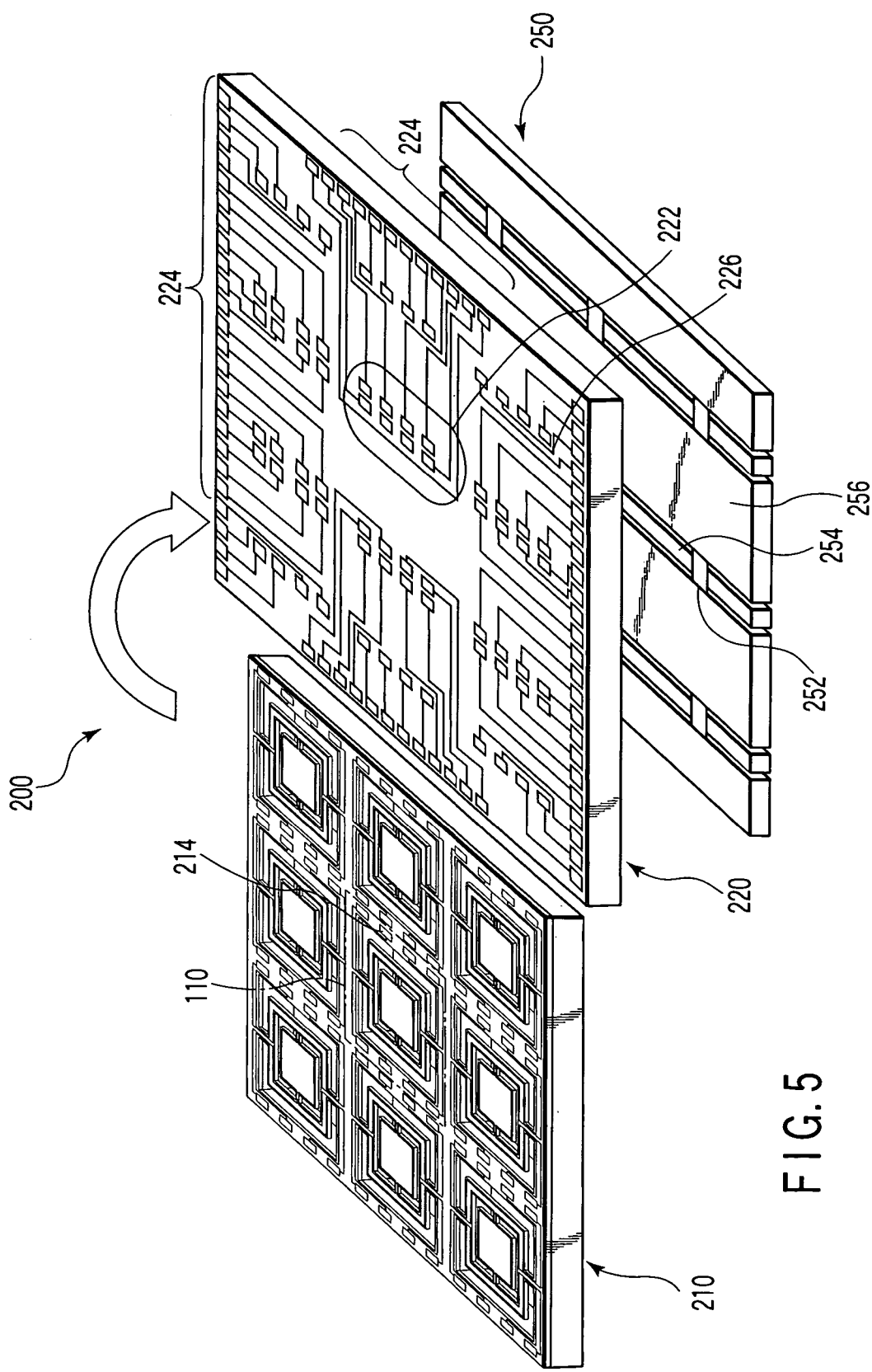
FIG. 5 is an exploded perspective view of the optical deflector array according to the first embodiment of the present invention.
Figure 6:
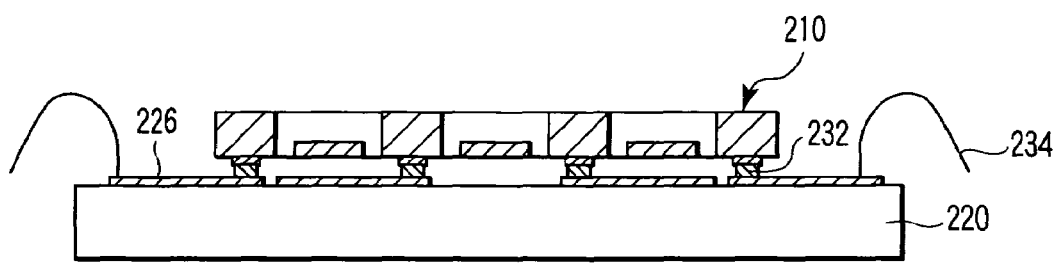
FIG. 6 is a view schematically showing a cross-section where the optical deflector array board and wiring board shown in FIG. 5 are joined to each other.
Figure 7:
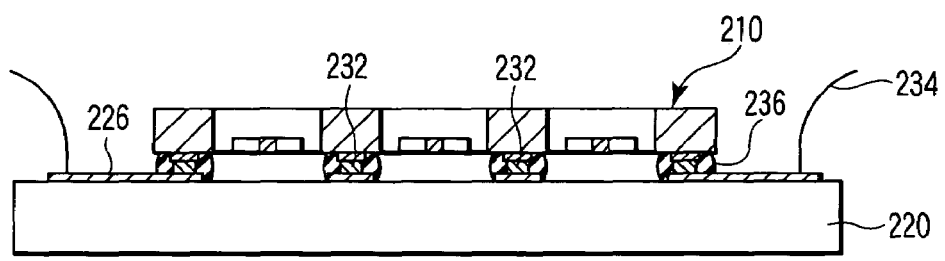
FIG. 7 is a view schematically showing a cross-section where the optical deflector array board and wiring board shown in FIG. 5 are joined to each other more preferably.
Figure 8:
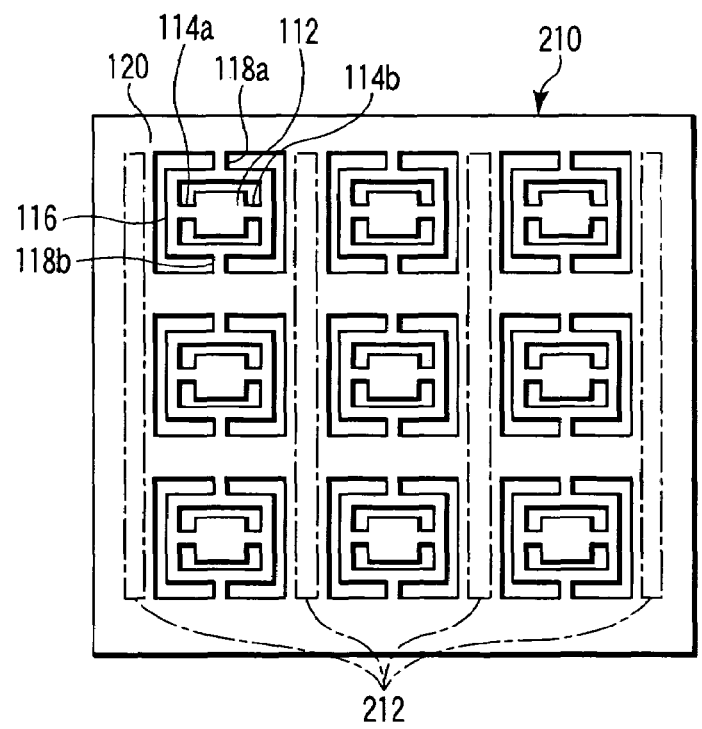
FIG. 8 is a plan view of the optical deflector array board in FIG. 5.

The optical deflector array according to this embodiment will be described below with reference to the views of the accompanying drawing. FIG. 5 is an exploded perspective view of the optical deflector array according to the first embodiment of the present invention. FIG. 6 schematically shows a cross-section where the optical deflector array board and wiring board shown in FIG. 5 are joined to each other. FIG. 7 schematically shows a cross-section where the optical deflector array board and wiring board shown in FIG. 5 are joined to each other more preferably. FIG. 8 is a plan view of the optical deflector array board shown in FIG. 5.

As shown in FIG. 5, an optical deflector array 200 comprises an optical deflector array board 210, wiring board 220, and magnet array 250.

The optical deflector array board 210 includes movable plate units 110, and substantially has an arrangement in which movable plate units 110 each identical to that shown in FIG. 1 are arranged. All the movable plate units 110 are oriented in the same direction. The optical deflector array board 210 having this arrangement is manufactured by forming the above movable plate units 110 side by side on one board. Each movable plate unit 110 includes eight electrode pads 144a, 144b, 146a, 146b, 164a, 164b, 166a, and 166b (which will be representatively written as an electrode pad 214 hereinafter).

The wiring board 220 includes connecting electrode pads 222, electrode pads 224, which are provided near the edge of the wiring board 220 and equal in number to the connecting electrode pads 222, and wirings 226, which electrically connect the connecting electrode pads 222 to the electrode pads 224.

The connecting electrode pads 222 are used for electrical connection with the optical deflector array board 210, and are formed at positions where they face the electrode pads 214 on the movable plate unit 110 of the optical deflector array board 210. The electrode pads 224 are used for external electrical connection. The wiring board 220 is larger than the optical deflector array board 210. The electrode pads 224 are formed at positions outside the optical deflector array board 210 in a state wherein the optical deflector array board 210 is joined to the wiring board 220.

As shown in FIG. 6, the optical deflector array board 210 and wiring board 220 are joined to each other through bumps 232. The bumps 232 are, for example, gold bumps, and electrically connect the electrode pads 214 of the optical deflector array board 210 to the connecting electrode pads 222 arranged to respectively face the electrode pads 214. The electrode pads 224 provided near the edge of the wiring board 220 are electrically connected to an external control board or package through, for example, bonding wires 234.

As described above, the electrode pads 214 of the movable plate unit 110 in the optical deflector array board 210 are electrically connected, through the bumps 232, to the connecting electrode pads 222 electrically connected to the electrode pads 224 for external electrical connection. The electrode pads 214 are therefore electrically connected to the electrode pads 224 for external electrical connection without through wirings extending between the remaining movable plate units 110 existing in the optical deflector array board 210.

For this reason, the movable plate units 110 can be arranged at smaller intervals. This makes it possible to obtain an optical deflector array with a higher packing density than the prior art.

The optical deflector array board 210 is preferably joined to the wiring board 220 by flip-chip bonding that uses a connecting resin 236 such as an anisotropic conductive paste (ACP), anisotropic conductive film (ACF), or non-conductive paste (NCP) in addition to the bumps 232, as shown in FIG. 7.

On the optical deflector array board 210, the electrode pads 214 are preferably provided in regions 212 separated from the outer torsion bars 118a and 118b connecting the outer movable plates 116 and the supports 120, as shown in FIG. 8. The electrode pads 214 of each movable plate unit 110 are preferably arranged on portions on the two sides along the axis of the inner torsion bars 114a and 114b, i.e., the first axis A1, which are located on the support 120 of a corresponding movable plate unit 110.

In other words, of four portions of the support divided by two virtual straight lines each of which is on a plane including the first and second axes A1 and A2 and divides associated diagonal two of four quadrants divided by the first and second axes A1 and A2, the connecting regions 212, in which the electrode pads 214 of the movable plate units 110 are arranged, are preferably located on two portions that do not include the connecting portions with the outer torsion bars 118a and 118b. In addition, more preferably, the connecting regions 212 are located in parts of the two portions that are near the first axis A1.

A detailed procedure for mounting the optical deflector array will be described below with reference to FIGS. 5, 7, and 8.

First of all, the bumps 232 are formed on the electrode pads 214 of all the movable plate units 110 of the optical deflector array board 210. The bumps 232 are preferably formed by, for example, a method of forming bumps from gold wires using a wire bonder or the like or a method of forming bumps by stacking a gold plating on a nickel plating.

The optical deflector array board 210 is mounted on the stage of a flip-chip bonder with the electrode pads 214 facing up, and the regions 212 shown in FIG. 8 are coated with the connecting resin 236 such as an ACP or NCP by a dispenser. The coating amount needs to be properly adjusted. However, since the regions 212 are spaced apart from the outer torsion bars 118a and 118b, the coating amount need not be adjusted with very high accuracy.

The rear surface of the wiring board 220 is then chucked by a mounting heater head, and the optical deflector array board 210 and wiring board 220 are stacked on each other so that the electrode pads 214 of the optical deflector array board 210 are positioned to the connecting electrode pads 222 of the wiring board 220 with the surface of the wiring board 220 on which the connecting electrode pads 222 are formed facing down. The optical deflector array board 210 and wiring board 220 are heated and pressurized. The viscosity of the ACP temporarily decreases upon heating. However, owing to the polymerization curing reaction of the ACP that occurs afterward, the ACP is cured so as to attract the optical deflector array board 210 and wiring board 220 while having shrinkage stress due to cure shrinkage.

With the above steps, the mounting of the optical deflector array board 210 and wiring board 220 is completed.

As described above, in a joint form called flip-chip bonding, which connects the metal bumps 232 with the connecting resin 236, the resin may flow out of the coating positions to the surroundings because of the following reasons: (1) the connecting resin 236 has fluidity, (2) the viscosity of the resin greatly decrease temporarily due to heating for resin curing in the mounting process, and (3) the resin is pressurized to be spread for mounting.

If the regions 212, i.e., the connecting electrode pads 222 and bumps 232, are located near the outer torsion bars 118a and 118b, such outflow of the resin may cause the resin to adhere to the outer torsion bars 118a and 118b. In this case, the mechanical characteristics of the outer torsion bars 118a and 118b change to affect the deflection characteristics, resulting, in the worst case, in deflection failure.

In this embodiment, since the connecting regions 212 are separated from the outer torsion bars 118a and 118b, the possibility that the resin will reach the outer torsion bars 118a and 118b is very low.

When heated and cured, the connecting resin 236 such as an ACP firmly connects and fixes the optical deflector array board 210 to the wiring board 220. In addition, residual stress is generated by cure shrinkage to make the optical deflector array board 210 and wiring board 220 attract each other. As a consequence, the bumps 232 and connecting electrode pads 222 are pressure-welded to each other more firmly by the residual stress, thereby realizing reliable connection in electrical terms as well.

In mounting operation, it is necessary to sufficiently heat the bumps 232 and connecting resin 236. Since the outer torsion bars 118a and 118b are spaced apart from the bumps 232 and connecting resin 236, even if the bumps 232 and connecting resin 236 are sufficiently heated by heating the wiring board 220 using the heater head, the outer torsion bars 118a and 118b can be effectively prevented from being excessively heated.

When the bumps 232 are to be formed as stud bumps, the bumps 232 are formed on the electrodes by ultrasonic waves. In this case, since the bumps 232 are spaced apart from the outer torsion bars 118a and 118b, the torsion bars are not susceptible to damage from ultrasonic waves.

As shown in FIG. 5, the magnet array 250 forms a magnetic field generating means or generator, and includes magnets 252 equal in number to the movable plate units 110 of the optical deflector array board 210, magnets 254 located on the two sides of each magnet 252 along the second axis A2, and magnets 256 located on both side of each magnet 252 along the first axis A1.

The magnet array 250 is placed on the opposite side to the optical deflector array board 210 through the wiring board 220. The magnet array 250 is fixed at a proper position on the surface of the wiring board 220 that is located on the rear side with respect to the surface on which the connecting electrode pads 222 are formed (i.e., the rear surface of the wiring board 220). Obviously, the magnet array 250 may be fixed to a member (not shown) so as to be separated from the wiring board 220. Preferably, however, the magnet array 250 is fixed to the wiring board 220.

While the magnet array 250 is placed at a proper position with respect to the optical deflector array board 210, the magnets 252 generally face the inner movable plates 112 of the movable plate units 110 of the optical deflector array board 210. In this state, the magnet 252 corresponding to one movable plate unit 110 corresponds to the magnet 172 in FIG. 4, parts of the magnets 254 that correspond to one movable plate unit 110 correspond to the magnets 174a and 174b in FIG. 4, and parts of the magnets 256 that correspond to one movable plate unit 110 correspond to the magnets 176a and 176b in FIG. 4.

In this embodiment, the magnets 254 and 256 of the magnet array 250 also serve as portions of the magnet units 170 of the movable plate units 110. However, the magnet array 250 may comprise a set of independent magnet units. That is, the magnet array 250 may comprise magnet units 170 shown in FIG. 4 equal in number to the movable plate units 110 of the optical deflector array board 210.

Since the magnet array 250 is placed on the rear side of the wiring board 220, the inner movable plates 112 can be placed near the magnets. For this reason, for example, as compared with a conventional arrangement in which a pair of large magnets are placed outer an optical deflector array obliquely with respect to two deflection axes (the first axis A1 and second axis A2) or a conventional arrangement in which a slight amount of leakage magnetic flux is used, the above arrangement has the following advantages:

(1) the magnetic flux density is high because the magnets are located near the drive wirings;

(2) a magnetic circuit can be formed by combining magnets; and (3) the directions of magnetic fluxes are oriented to be perpendicular to the drive wirings that have effects on the two deflection axes.

This makes it possible to improve the actuation efficiently in particular.

In addition, since the wiring board 220 is made of a non-magnetic material, it has generally no influence on the magnetic circuit, and the magnetic array can be stably held at a proper position with respect to the optical deflectors.

Furthermore, as compared with an arrangement in which magnets are arranged on sides of the respective deflectors, i.e., between the deflectors, the above arrangement allows deflectors to be arranged at smaller intervals. In addition, making each magnet protrude from the incident surface side of a corresponding optical deflector prevents incident light or exit light to/from the optical deflector from being interfered.

As described above, in this embodiment, since the magnetic array is placed on the rear side of the wiring board, the magnets do not interfere with incident light or exit light, and the distance between the optical deflectors and the magnets can be reduced. This makes it possible to obtain an electromagnetically actuated optical deflector array with a high packing density and high actuation efficiency.

Figure 9:
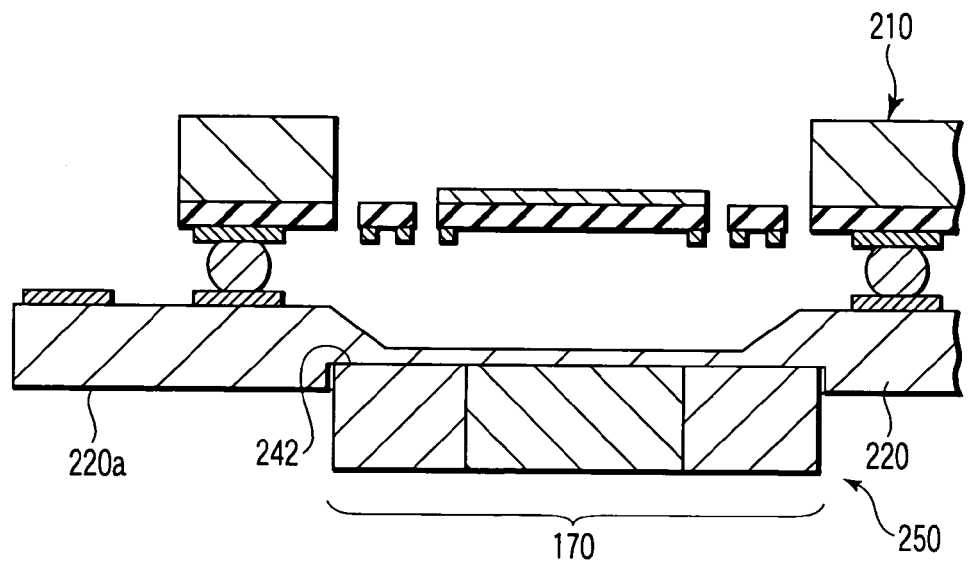
FIG. 9 is a view schematically showing a cross-sectional structure of the wiring board in this embodiment.

FIG. 9 schematically shows a cross-sectional structure of the wiring board in this embodiment. FIG. 9 corresponds to an example in which the magnet array 250 comprises magnet units 170, each identical to that shown in FIG. 4, equal in number to the movable plate units 110 of the optical deflector array board 210.

As described above, the magnet array 250 is fixed at a proper position on the rear surface of the wiring board 220. For this purpose, the wiring board 220 has positioning portions for positioning the magnet array 250. More specifically, guide grooves 242 equal in number to the magnet units 170 are formed in a rear surface 220a of the wiring board 220 so as to tightly accommodate the magnet units 170 constituting the magnet array 250.

Each guide groove 242 is formed into a proper shape and at a proper position in accordance with the wiring pattern on the wiring board 220. The wiring board 220 is manufactured by performing wiring patterning on the front surface and etching on the rear surface 220a after the front and rear surfaces are aligned on an Si board by a double-sided aligner.

Since each guide groove 242 is formed into a proper shape and at a proper position in accordance with the wiring pattern on the wiring board 220, when the optical deflector array board 210 and wiring board 220 are joined to each other with the electrode pads 214 facing the connecting electrode pads 222, the guide grooves 242 are, at the same time, placed at proper positions with respect to the corresponding movable plate units 110.

The magnet units 170 constituting the magnet array 250 are accommodated and fixed in the guide grooves 242, respectively. With this operation, the magnet units 170 are arranged at proper positions with respect to the corresponding movable plate units 110 with high precision. As a consequence, an optical deflector array with high actuation efficiency can be easily obtained.

Without such guide grooves, since the movable plate units 110 corresponding to the magnet units 170 cannot be observed through the wiring board 220 at the time of assembly, it is difficult to hold the relative positions between the magnet units 170 and the movable plate units 110 in a proper state.

There has been exemplified the case wherein the magnet array 250 comprises the magnet units 170 equal in number to the movable plate units 110 of the optical deflector array board 210. As shown in FIG. 5, however, the magnet array 250 may comprise one magnet group instead of the independent magnet units 170, as shown in FIG. 5. Accordingly, the wiring board 220 may have one guide groove that can accommodate the magnet group.

First Modification to First Embodiment

Figure 11:
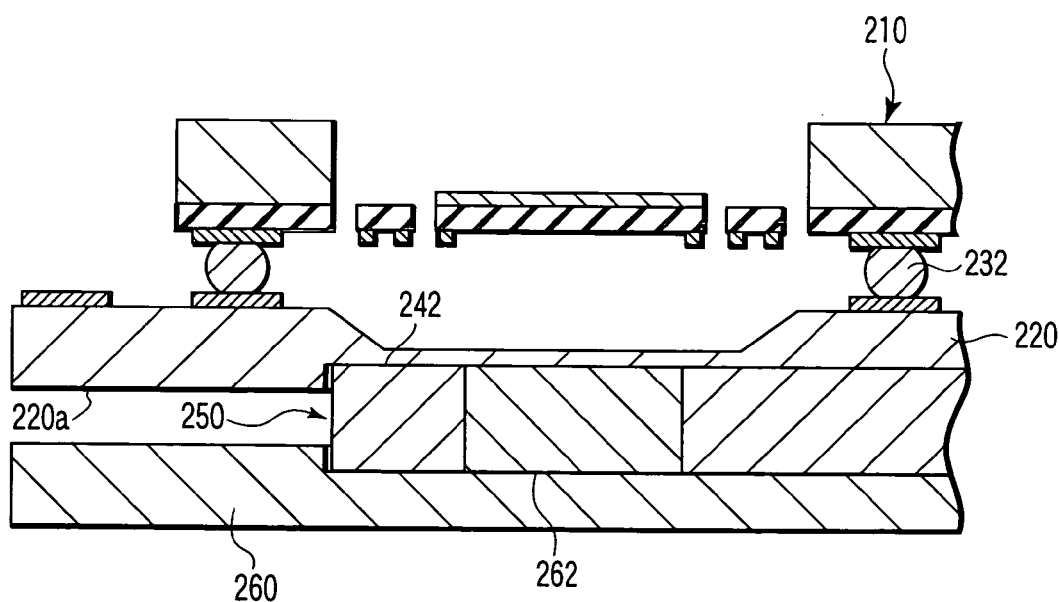
FIG. 11 is a view showing a partial cross-section of the assembled optical deflector array shown in FIG. 10.
Figure 10:
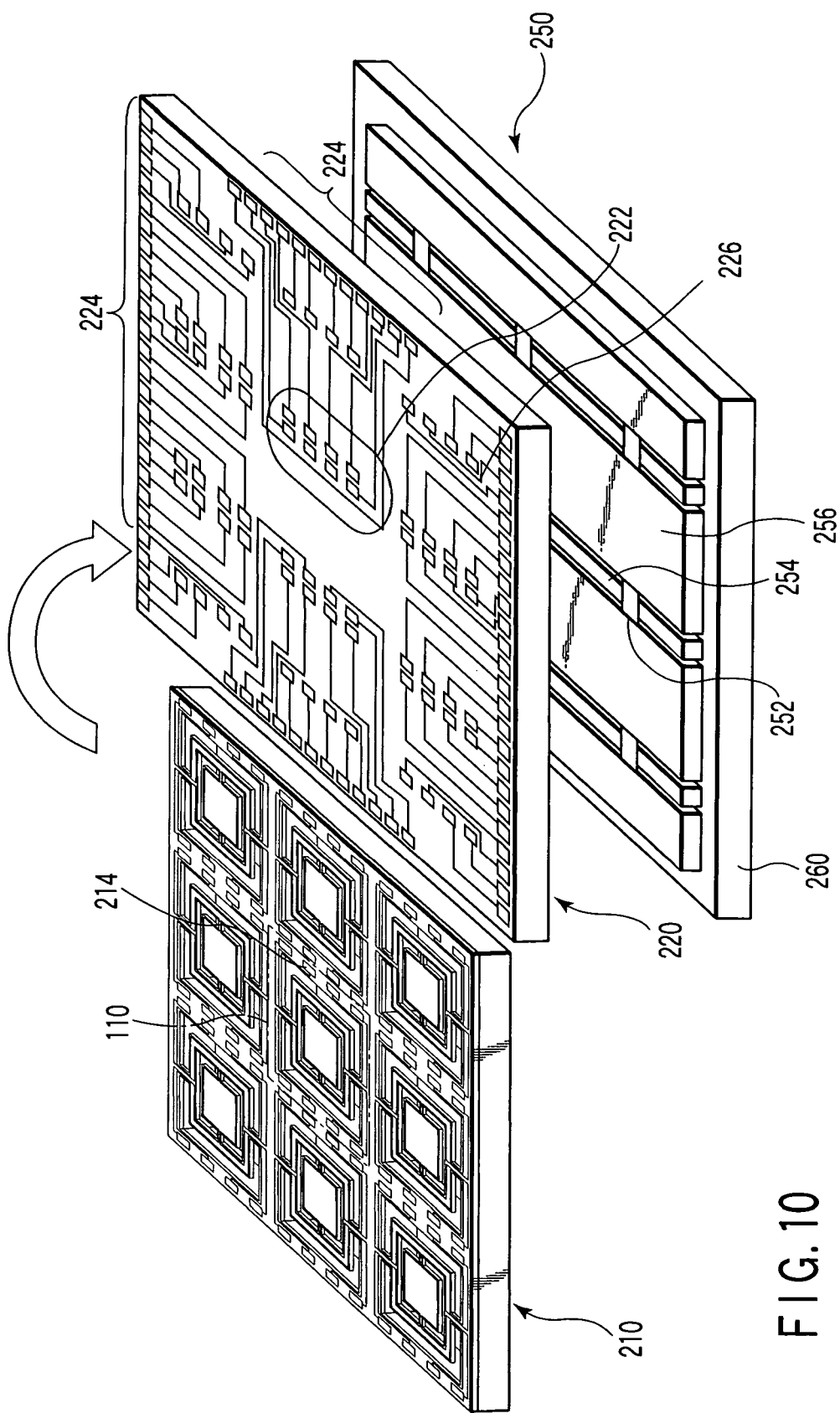
FIG. 10 is an exploded perspective view of another optical deflector array according to the first modification to the first embodiment.

FIG. 10 is an exploded perspective view of another optical deflector array according to this embodiment. FIG. 11 schematically shows a partial cross-section of the assembled optical deflector array in FIG. 10.

This optical deflector array differs from the optical deflector array described above in the magnet array 250.

As shown in FIG. 10, in this optical deflector array, in addition to the magnets 252, 254, and 256, the magnet array 250 includes a holding board 260 holding these magnets. The holding board 260 has a positioning portion for accommodating the magnet array 250 at a proper position. More specifically, the holding board 260 has a guide groove 262 that can tightly accommodate the magnet array 250, as shown in FIG. 11.

The holding board 260 is preferably manufactured by etching a semiconductor such as silicon like the wiring board 220 in order to accurately form the groove in particular. However, the method of manufacturing the holding board 260 is not limited to this. The holding board 260 may be manufactured from a ceramic material, metal plate, resin board, or the like by a technique such as press working or machining.

The wiring board 220 also has a positioning portion for accommodating the magnet array 250 at a proper position. More specifically, the wiring board 220 has the guide groove 242 in the rear surface 220a. The guide groove 242 can tightly accommodate the magnets 252, 254, and 256. The guide groove 242 is formed into a proper shape and at a proper position in accordance with the wiring pattern on the wiring board 220.

In assembling an optical deflector array, first of all, the optical deflector array board 210 and wiring board 220 are joined to each other such that the electrode pads 214 face the connecting electrode pads 222. At this time, since each guide groove 242 is formed into a proper shape and at a proper position in accordance with the wiring pattern on the wiring board 220, the guide grooves 242 are arranged at proper positions with respect to the corresponding movable plate units 110.

Before assembling of the optical deflector array, the magnets 252, 254, and 256 are fixed to the holding board 260 with an epoxy-based adhesive or the like. The magnets 252, 254, and 256 held on the holding board 260 are positioned by being accommodated in the corresponding guide groove 242 of the wiring board 220, and mechanically fixed to the wiring board 220 by means of, for example, an adhesive or holding member.

In the above optical deflector array (shown in FIGS. 5 to 9), magnets are mounted one by one on the wiring board 220 while the structure comprising the optical deflector array board 210 and wiring board 220, which have already been joined to each other, is placed on a base with the wiring board 220 facing up. It is very difficult to assemble a magnet array in a state wherein complicated forces act between the magnets due to attractive and repulsive forces between the magnets. As magnets strongly attract or repel, impacts may be applied to optical deflectors to damage them.

If the deflector array is mounted on the wiring board 220 after the magnets are mounted, since the wiring board 220 is heated to a high temperature, the magnets may be demagnetized. That is, this procedure is not preferable.

In the optical deflector array (shown in FIGS. 10 and 11) of this modification, the holding board 260 for the magnets is prepared independently of the wiring board 220, and the magnets are mounted on the holding board 260 in advance. This provides high workability and can prevent adverse effects on the optical deflectors and demagnetization.

In addition, the layout of magnets can be corrected by checking the magnet array in advance, and the possibility that the expensive optical deflector array will be damaged by magnet failures can be reduced.

When magnets are to be assembled into an array, the holding board and magnets must be held with strong force because of attractive and repulsive forces among the magnets. In addition, there is a high possibility that the holding board will fail to hold a magnet, and the magnet will behave violently, a magnet array is preferably assembled while no delicate deflector is present nearby.

In this optical deflector array, the magnets of the magnet array 250 are held at proper position by the guide grooves 262 of the holding board 260. In addition, by fitting the magnets in the guide grooves 242 of the wiring board 220, the magnets can be placed at proper position with respect to both the wiring board 220 and the optical deflector array board 210. With this arrangement, a stable magnetic circuit is formed. This makes it possible to reduce variations in actuation characteristics for each optical deflector of the optical deflector array. Therefore, an optical deflector array can easily be manufactured with highly stable quality and high yield.

There has been exemplified the case wherein the positioning portions of the holding board 260 are formed from the guide grooves 262. However, the arrangement of the positioning portion is not limited to this. Any arrangement can be used as long as the magnet array 250 can be positioned.

Second Modification to First Embodiment

Figure 12:
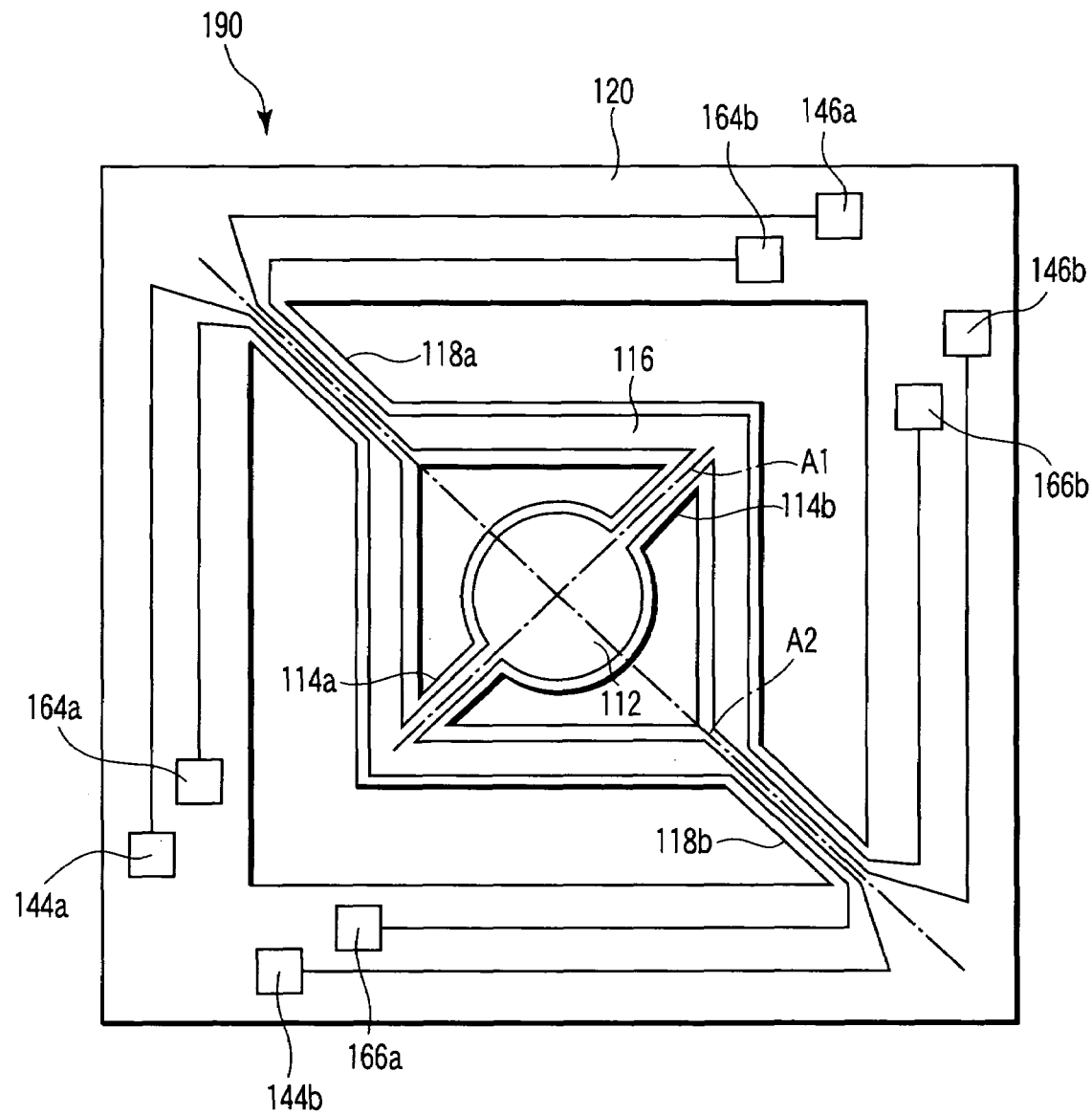
FIG. 12 is a view showing another unit movable plate unit, which may be used in place of the movable plate unit shown in FIG. 3, according to the second modification to the first embodiment.
Figure 13:
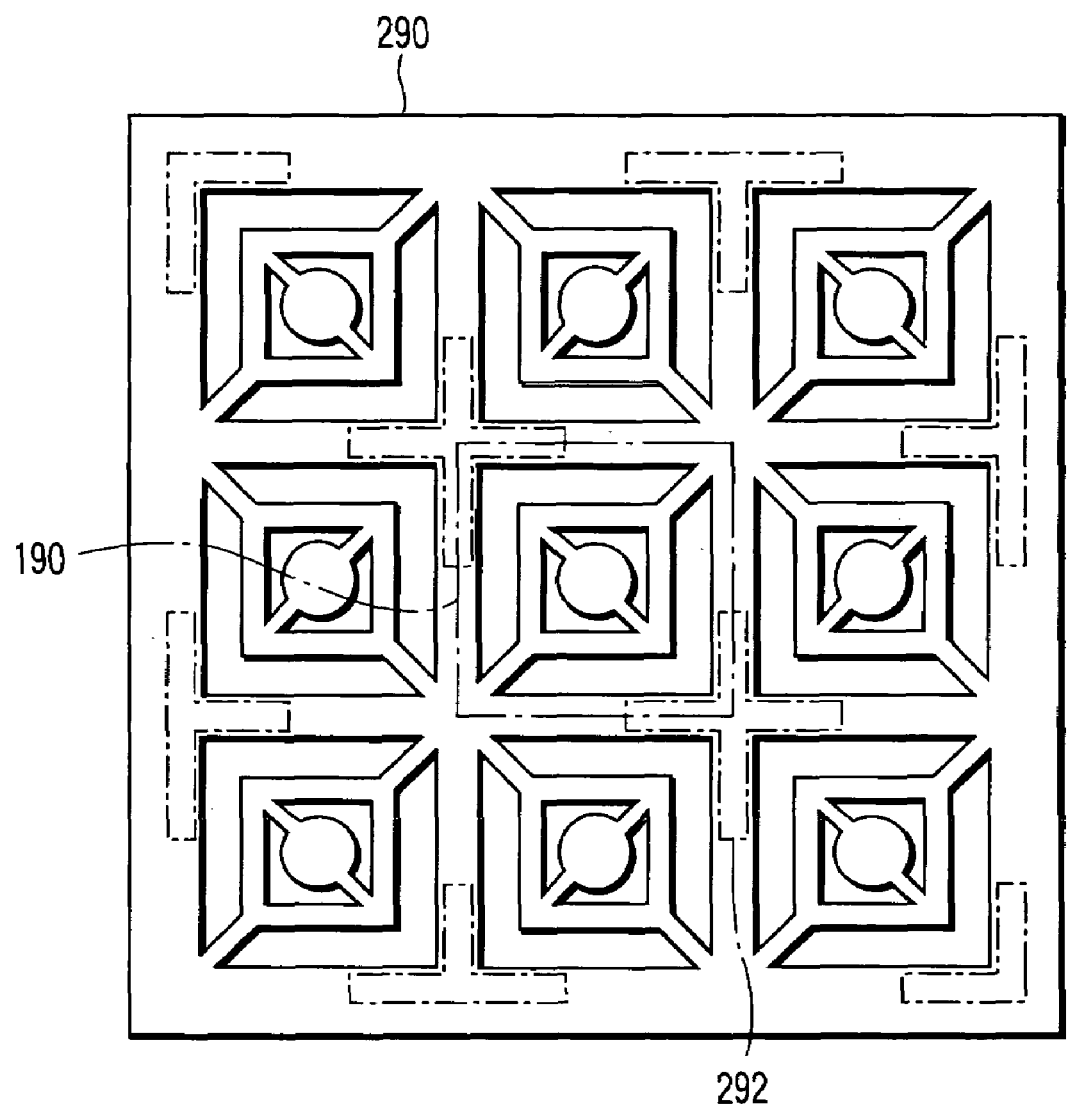
FIG. 13 is a view showing an optical deflector array board comprising movable plate units each identical to that shown in FIG. 12.

In addition, the movable plate unit 110 is not limited to the one having the above arrangement, and may have another arrangement. FIG. 12 shows another unit movable plate unit, which can be used in place of the movable plate unit shown in, for example, FIG. 3. FIG. 13 shows an optical deflector array board comprising movable plate units each shown in FIG. 12.

A movable plate unit 180 shown in FIG. 12 differs from the movable plate unit shown in FIG. 3 in the following points. The inner movable plate 112 has a circular contour. Both the inner and outer peripheries of the outer movable plate 116 have square contours. The first and second axes extend along diagonal lines of the outer movable plate 116. That is, the inner torsion bars extend along one diagonal line of the outer movable plate 116, whereas the outer torsion bars extend along the other diagonal line of the outer movable plate 116.

On an optical deflector array board 290 shown in FIG. 13, the movable plate units 180 are arrayed such that the outer torsion bars are adjacent to each other. That is, on the optical deflector array board 290, the movable plate units 180 are arranged in two kinds of orientations different from each other by 90°, and the movable plate units 180 in the two kinds of orientations are arrayed in a checkered pattern.

Like the regions 212 described above, of four portions of the support divided by two virtual straight lines each of which is on a plane including the first and second axes A1 and A2 and divides associated diagonal two of four quadrants divided by the first and second axes A1 and A2, connecting regions 292, in which the electrode pads 144*a*, 144*b*, 146*a*, 146*b*, 164*a*, 164*b*, 166*a*, and 166*b* are arranged, are preferably located on two portions that do not include the connecting portions with the outer torsion bars 118*a* and 118*b*. More preferably, the connecting regions 292 are located in parts of these two portions that are nearer the first axis.

On the optical deflector array board 290, the torsion bars 114*a*, 114*b*, 118*a*, and 118*b* extend along diagonal lines of the outer movable plate 116. Even if, therefore, the torsion bars 114*a*, 114*b*, 118*a*, and 118*b* are equal in length, the unit movable plate unit 180 of the optical deflector array board 290 is smaller than the unit movable plate unit 110 of the optical deflector array board 210 shown in FIG. 7. Therefore, the movable plate unit 180 is suitable for increasing the packing density of the optical deflector array.

The arrangement of the optical deflector array of this embodiment may be variously modified and changed in addition to the above modifications.

In the optical deflector array of this embodiment, the magnetic field generating means or generator comprises magnets arranged on the rear side of the wiring board. However, the present invention is not limited to this. The magnetic field generating means or generator may comprise only one magnet placed on the rear side of the wiring board, or one magnet or magnets arranged on a side of the optical deflector array board 210.

For example, an optical deflector to be applied to an optical deflector array may be an optical deflector similar to the conventional optical deflector disclosed in U.S. Pat. No. 6,388,789, or a combination of various arrangements. By applying this embodiment to these optical deflectors, optical deflector arrays superior to the conventional optical deflector arrays can be obtained.

As the bumps 232, solder bumps, solder balls, gold bumps, stud bumps, plated bumps, or the like can be used. As a material for the outer torsion bar portions of the deflector, Si, SiN, $SiO_2$, polyimide resin, fluoroplastic, silicone resin, or the like can be selected. A material that can be MEMS-processed, such as silicon, can be used for the optical deflector array board 210. Silicon, glass, ceramic, or the like can be used for the wiring board 220.

Third Modification to First Embodiment

Figure 14:
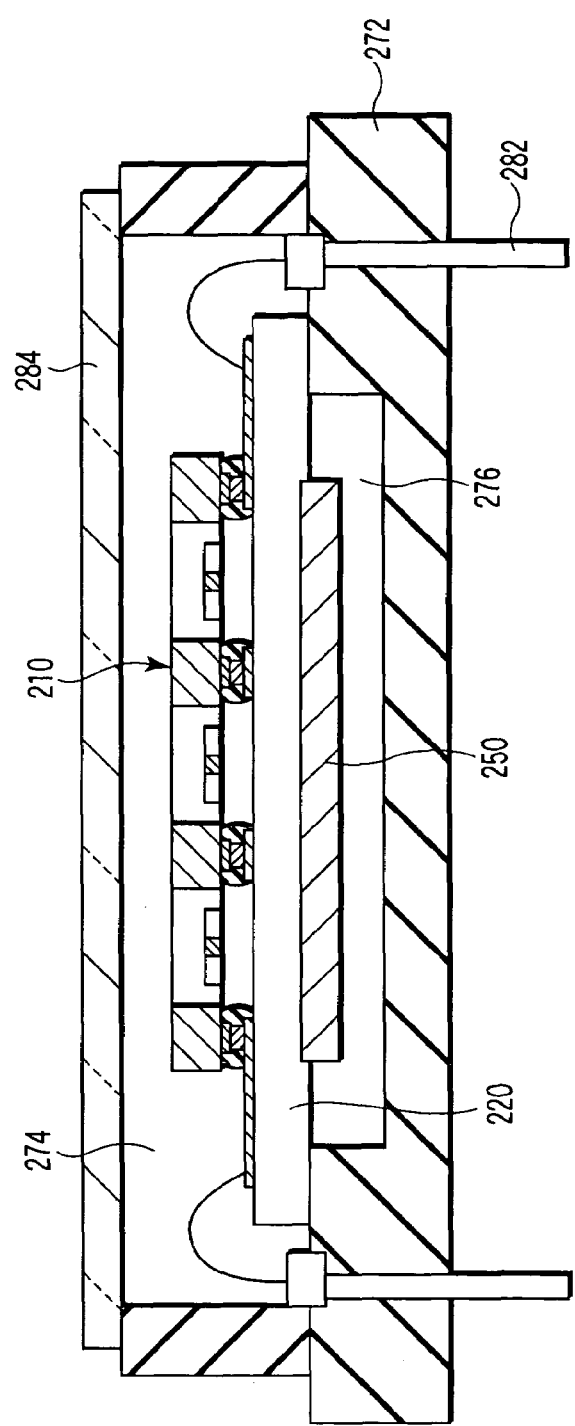
FIG. 14 is a sectional view of an optical deflector array further comprising a package according to the third modification to the first embodiment.

FIG. 14 shows a cross-section of an optical deflector array further comprising a package. As shown in FIG. 14, a package 272 has a recess portion 274 that can accommodate the optical deflector array board 210, wiring board 220, and magnet array 250. A counter bore 276 for accommodating the magnet array 250 is formed in the bottom surface of the recess portion 274. The structure comprising the optical deflector array board 210, wiring board 220, and magnet array 250 is accommodated in the recess portion 274 of the package 272. The wiring board 220 is, for example, bonded to the bottom surface of the recess portion 274.

Electrodes 282 are provided for the package 272. The electrode pads of the wiring board 220 are electrically connected to the electrodes 282 by die bonding or wire bonding. The recess portion 274 of the package 272 is covered with an optically transparent cover 284 and hermetically sealed.

Second Embodiment

This embodiment is directed to an optical deflector array in which uniaxially actuated optical deflectors that deflect light beams about one axis are arranged two-dimensionally.

Figure 15:
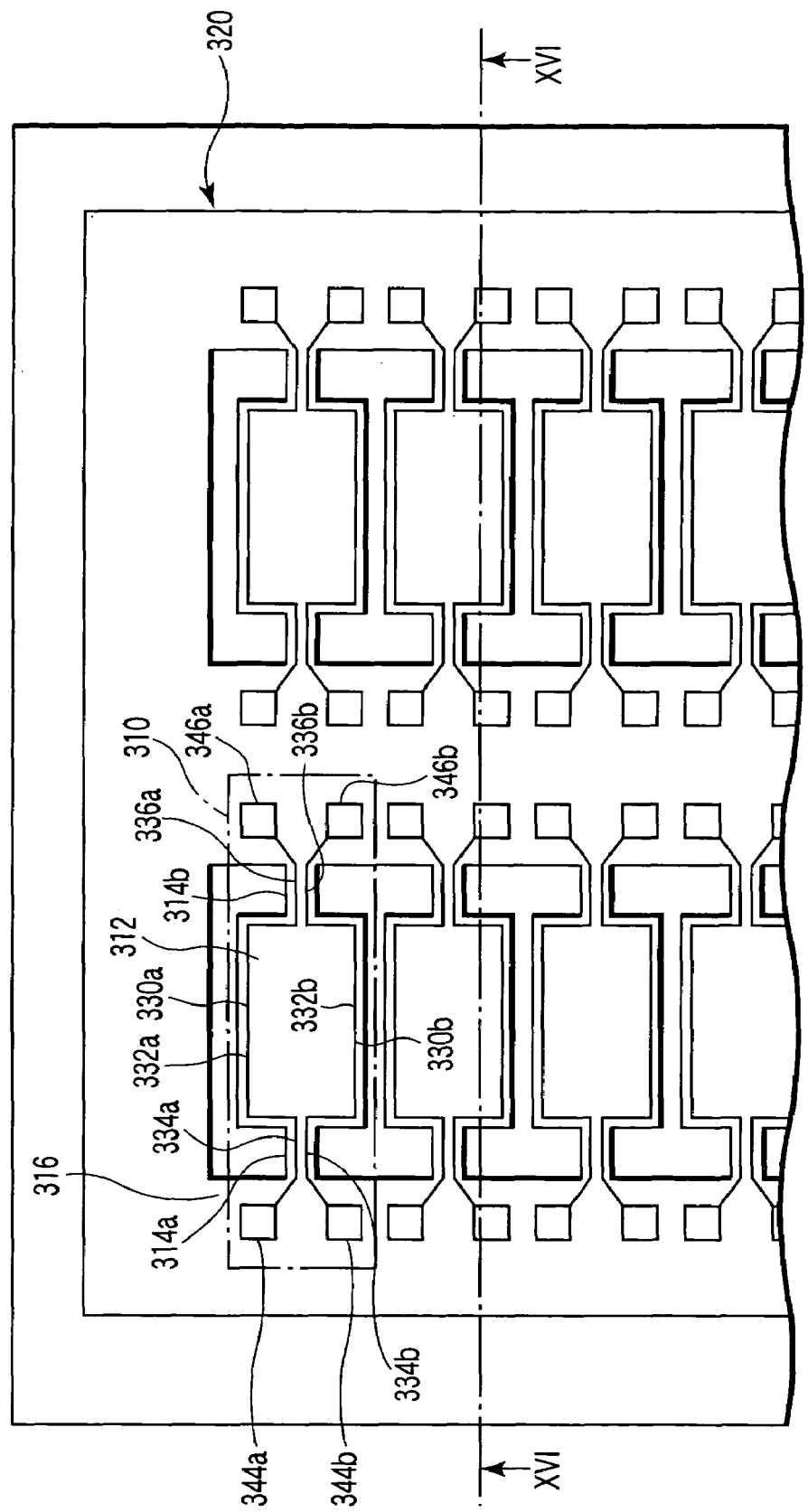
FIG. 15 is a plan view of an optical deflector array board and wiring board in an optical deflector array according to the second embodiment of the present invention.

FIG. 15 is a plan view of an optical deflector array and wiring board in the optical deflector array according to the second embodiment of the present invention.

As shown in FIG. 15, an optical deflector array board 320 according to this embodiment includes movable plate units 310. Each movable plate unit 310 corresponds to a unit optical deflector of the optical deflector array.

Each movable plate unit 310 includes a movable plate 312, a support 316 located outside the movable plate 312, and two torsion bars (first torsion bar 314*a* and second torsion bar 314*b*) connecting the movable plate 312 and the support 316.

The movable plate 312 has, on its upper surface, a reflecting surface 322 for reflecting light. The two torsion bars 314*a* and 314*b* both extend on a generally straight line along a first axis A1. The torsion bars 314*a* and 314*b* can twist and deform about the first axis A1 and allows the movable plate 312 to tilt about the first axis A1 with respect to the support 316.

The movable plate units 310 includes two wirings (first wiring 330*a* and second wiring 330*b*) extending on the movable plate 312, torsion bars 314*a* and 314*b*, and support 316. The first wiring 330*a* and second wiring 330*b* are located generally symmetrically with respect to the first axis A1. The first wiring 330*a* includes a first drive wiring portion 332*a* and two first extracted wiring portions 334*a* and 336*a* extending from the two ends of the first drive wiring portion 332*a*. Likewise, the second wiring 330*b* includes a second drive wiring portion 332*b* and two second extracted wiring portions 334*b* and 336*b* extending from the two ends of the second drive wiring portion 332*b*.

In this case, the drive wiring portions 332*a* and 332*b*, which are parts of the wirings 330*a* and 330*b* that actually contribute to the actuation of the movable plate 312, are located near the edge of the movable plate 312, and extend parallel to the first axis A1. The first extracted wiring portions 334*a* and 336*a* are parts of the first wiring 330*a* that exclude the first drive wiring portion 332*a*. Likewise, the second extracted wiring portions 334*b* and 336*b* are parts of the second wiring 330*b* that exclude the second drive wiring portion 332*b*.

The first extracted wiring portion 334*a* extending from the left end portion of the first drive wiring portion 332*a* on the upper side extends downward along by the periphery of the movable plate 312, passes through the first torsion bar 314*a* on the left side, and is terminated at an electrode pad 344*a* provided on the support 316. The first extracted wiring portion 336*a* extending from the right end portion of the first drive wiring portion 332*a* extends downward along by the periphery of the movable plate 312, passes through the second torsion bar 314*b* on the right side, and is terminated at an electrode pad 346*a* provided on the support 316.

The second extracted wiring portion 334*b* extending from the left end portion of the second drive wiring portion 332*b* extends upward along by the periphery of the movable plate 312, passes through the first torsion bar 314*a* on the left side, and is terminated at an electrode pad 334*b* provided on the support 316. The second extracted wiring portion 336*b* extending from the right end portion of the second drive wiring portion 332*b* extends upward along by the periphery of the movable plate 312, passes through the second torsion bar 314*b* on the right side, and is terminated at an electrode pad 346*b* provided on the support 316.

Although not specifically shown, the wirings 330*a* and 330*b* are preferably covered with an insulating film such as a silicon oxide film for electrical insulation.

Figure 16:
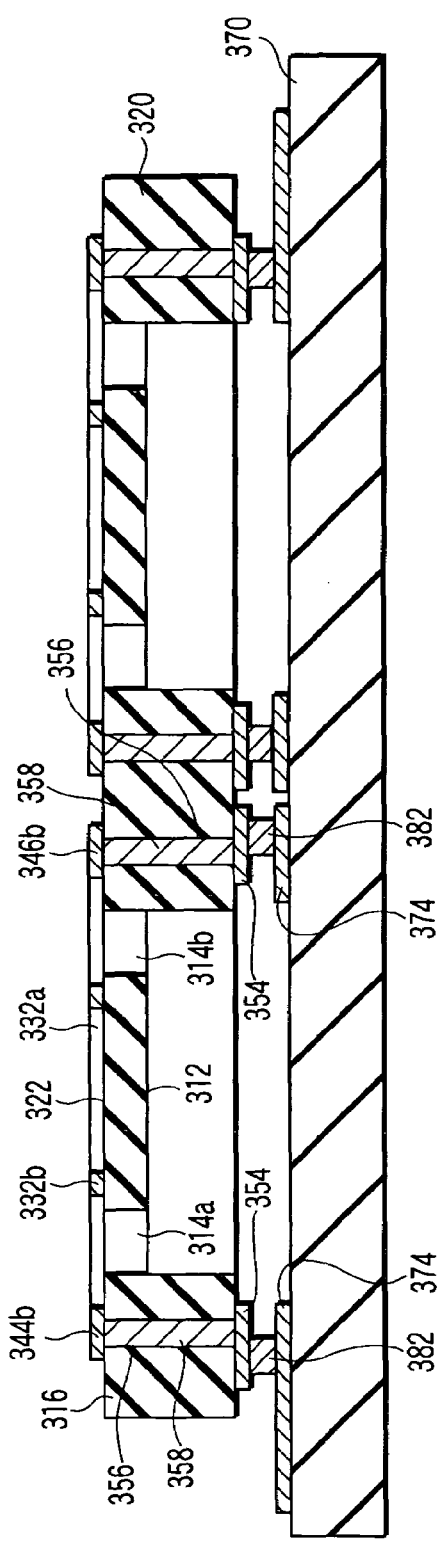
FIG. 16 is a sectional view taken along a line XVI—XVI of the optical deflector array board and wiring board in FIG. 15.

FIG. 16 is a sectional view taken along a line XVI—XVI of the optical deflector array board and wiring board in FIG. 15.

As shown in FIG. 16, the electrode pads 344*a*, 344*b*, and 346*b* are provided on the upper surface of the optical deflector array board 320. In addition, connecting electrode pads 354 are formed on the lower surface of the optical deflector array board 320 at positions corresponding to the electrode pads 344*a*, 344*b*, 346*a*, and 346*b*. The electrode pads 344*a*, 344*b*, 346*a*, and 346*b* are electrically connected to the connecting electrode pads 354 through conductive members 358 filled in via holes 356 extending through the optical deflector array board 320.

A wiring board 370 includes electrode pads 374. The electrode pads 374 are provided at positions where they face the connecting electrode pads 354 of the optical deflector array board 320. The optical deflector array board 320 is connected to the wiring board 370 through bumps 382. The bumps 382 electrically connect the connecting electrode pads 354 to the electrode pads 374 as well as mechanically connecting the optical deflector array board 320 to the wiring board 370.

Although not shown in FIGS. 15 and 16, the optical deflector array includes magnets, which generate magnetic fields required to actuate the movable plates 312. The magnets are arranged on the rear side or a side of the wiring board 370.

As described above, the electrode pads 344*a*, 344*b*, 346*a*, and 346*b* provided on the upper surface of the optical deflector array board 320 are electrically connected to the connecting electrode pads 354 provided on the lower surface of the optical deflector array board 320 through the conductive members 358 filled in the via holes 356 formed in the optical deflector array board 320. The connecting electrode pads 354 of the optical deflector array board 320 are electrically connected to the electrode pads 374 of the wiring board 370.

The extracted wiring portions 334*a*, 336*a*, 334*b*, and 336*b* can therefore be laid out without being routed between the remaining movable plate units 310 existing in the optical deflector array board 320. For this reason, the movable plate units 110 can be arranged at smaller intervals. This makes it possible to obtain an optical deflector array with a higher packing density than the prior art.

Although not shown in FIG. 16, as in the first embodiment, the electrode pads 374 of the wiring board 370 are electrically connected to electrode pads, which are used for external electrical connection, through wirings extending to the outer periphery of the wiring board 370.

This embodiment can form an array of movable plate units 310 arranged at small intervals without providing beams between the movable plates 312.

In this embodiment, in particular, since the reflecting surfaces 322 of the movable plates 312 and the wiring surface of the optical deflector array board 320 are formed in the same plane, and the ends of the support frame for the optical deflector array board 320 do not protrude high on the incident side and exit side of light beams, interference between an incident light beam, a reflected light beam, and the support frame can be prevented more effectively.

In addition, since the torsion bars 314a and 314b are separated from the connecting bumps 382 by the thickness of the optical deflector array board 320, a connecting resin such as an ACP, NCP, or conductive resin can be applied to around the bumps 382. This improves the mountability.

In summary, this embodiment has the following advantages.

(1) Since the interval between the wiring board 370 and the mirror board can be set to be large, a large deflection angle can be obtained.

(2) Since the wiring board 370 is mounted on the surface opposite to that surface of the optical deflector array board 320 on which the torsion bars 314a and 314b are provided, even if the torsion bars 314a and 31b and bumps are arranged near each other in a direction within the substrate plane, bump connection can be done by using a resin without the adverse effects of the resin on the torsion bars 314a and 314b.

(3) Since there are no boundary frames between the adjacent movable plates 312, the packing density is high.

As described above, in this embodiment, using the wiring board 370 independently of the optical deflector array board 320 makes it possible to obtain an optical deflector array with a higher packing density than the prior art.

Note that as described in this embodiment, the above effect is also very high even for an uniaxial actuation optical deflector array.

The arrangement of the optical deflector array of this embodiment can be variously modified and changed.

The wiring board 370 may be formed into a multilayer wiring board or multistage/multilayer board, and may be fixed to a resin board by FC bonding. This makes it possible to cope with a larger array without decreasing the packing density. Since an MEMS process and multilayer wiring process are not mixed together, the productivity improves, and a reduction in yield can be prevented.

As connecting members, gold bumps, solder bumps, plated bumps, and or like can be used. In addition, an ACP, NCP, conductive paste, or the like can be used together.

A material that can be MEMS-processed, such as silicon, can be used for an MEMS board. Silicon, glass, ceramic, or the like can be used for a wiring board. When a multistage board is to be used, a resin board can also be used.

For a wiring board, silicon, ceramic, or the like can be used. Alternatively, a resin substrate may be used.

For a magnet holding board, silicon, glass, ceramic, a metal, or the like can be used. Alternatively, a magnetic material may be used. In addition, a resin can be used.

Aluminum can be used for wirings. Alternatively, copper, gold, Ni, or the like can be used.

For electrode pads, aluminum can be suitably used. In addition, Cr, Ti, Ni, Au, or the like can be used as a UBM for soldering. Gold or the like can be used for gold bumps.

Via holes may be formed in the deflector array board to distribute the wirings and electrode pads on the upper and lower surfaces. In this case, the electrode pads on the upper surface are electrically connected to the wiring board by wire bonding, and the electrode pads on the lower surface are electrically connected to the wiring board through bumps. This makes it possible to obtain an optical deflector array with a higher packing density.

Although the embodiments of the present invention have been described with reference to the views of the accompanying drawing, the present invention is not limited to these embodiments, and various modifications and changes thereof can be made within the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical deflector array, which includes electromagnetically actuated optical deflectors, comprising:
   a first board having movable plates respectively having reflecting surfaces, wirings passing through the respective movable plates, and first connecting portions provided at two ends of the each wiring;
   a second board having second connecting portions electrically connected to the first connecting portions of the first board, third connecting portions for external electrical connection, and connecting wirings electrically connecting the second connecting portions and the third connecting portions;
   connecting members that electrically connect the first connecting portions of the first board to the second connecting portions of the second board; and
   magnetic field generating means for generating a magnetic field;
   wherein the first board further has, for each of the deflectors, an outer movable plate located outside the movable plate, two inner torsion bars connecting the movable plate and the outer movable plate, a support located outside the outer movable plate, and two outer torsion bars connecting the outer movable plate and the support, the inner torsion bars extending along a first axis, and the outer torsion bars extending along a second axis substantially perpendicular to the first axis, and of four portions of the support divided by two virtual straight lines each of which is on a plane including the first and second axes and divides associated diagonal two of four quadrants divided by the first and second axes, the first connecting portions are located on two portions that exclude connecting portions with the outer torsion bars.

2. An optical deflector array, which includes electromagnetically actuated optical deflectors, comprising:
   a first board having movable plates respectively having reflecting surfaces, wirings passing through the respective movable plates, and first connecting portions provided at two ends of the each wiring;
   a second board having second connecting portions electrically connected to the first connecting portions of the first board, third connecting portions for external electrical connection, and connecting wirings electrically connecting the second connecting portions and the third connecting portions;
   connecting members that electrically connect the first connecting portions of the first board to the second connecting portions of the second board;
   magnetic field generating means for generating a magnetic field; and
   a package having a recess portion that can accommodate the first board, the second board, and the magnetic field generating means, and an optically transparent cover that covers the recess portion of the package.

3. An optical deflector array, which includes electromagnetically actuated optical deflectors, comprising:
   a first board having movable plates respectively having reflecting surfaces, wirings passing through the respective movable plates, and first connecting portions provided at two ends of the each wiring;
a second board having second connecting portions electrically connected to the first connecting portions of the first board, third connecting portions for external electrical connection, and connecting wirings electrically connecting the second connecting portions and the third connecting portions;
connecting members that electrically connect the first connecting portions of the first board to the second connecting portions of the second board; and
a magnetic field generator, which generates a magnetic field;
wherein the first board further has, for each of the deflectors, an outer movable plate located outside the movable plate, two inner torsion bars connecting the movable plate and the outer movable plate, a support located outside the outer movable plate, and two outer torsion bars connecting the outer movable plate and the support, the inner torsion bars extending along a first axis, and the outer torsion bars extending along a second axis substantially perpendicular to the first axis, and of four portions of the support divided by two virtual straight lines each of which is on a plane including the first and second axes and divides associated diagonal two of four quadrants divided by the first and second axes, the first connecting portions are located on two portions that exclude connecting portions with the outer torsion bars.

4. An optical deflector array, which includes electromagnetically actuated optical deflectors, comprising:
a first board having movable plates respectively having reflecting surfaces, wirings passing through the respective movable plates, and first connecting portions provided at two ends of the each wiring;
a second board having second connecting portions electrically connected to the first connecting portions of the first board, third connecting portions for external electrical connection, and connecting wirings electrically connecting the second connecting portions and the third connecting portions;
connecting members that electrically connect the first connecting portions of the first board to the second connecting portions of the second board;
a magnetic field generator, which generates a magnetic field; and
a package having a recess portion which can accommodate the first board, the second board, and the magnetic field generator, and an optically transparent cover that covers the recess portion of the package.

* * * * *

UNITED STATES PATENT AND TRADEMARK OFFICE
CERTIFICATE OF CORRECTION

| | |
|---|---|
| PATENT NO. | : 7,230,743 B2 |
| APPLICATION NO. | : 10/999772 |
| DATED | : June 12, 2007 |
| INVENTOR(S) | : Daisuke Matsuo et al. |

Page 1 of 1

It is certified that error appears in the above-identified patent and that said Letters Patent is hereby corrected as shown below:

Title page:

(30)    Foreign Application Priority Data

January 12, 2003    (JP) .......................... 2003-402136 should read

(30)    Foreign Application Priority Data

December 01, 2003    (JP) .......................... 2003-402136

Signed and Sealed this

Seventh Day of August, 2007

JON W. DUDAS
*Director of the United States Patent and Trademark Office*